US005895530A

United States Patent [19]

Shrotriya et al.

[11] Patent Number: 5,895,530
[45] Date of Patent: Apr. 20, 1999

[54] METHOD AND APPARATUS FOR DIRECTING FLUID THROUGH A SEMICONDUCTOR PROCESSING CHAMBER

[75] Inventors: Ashish Shrotriya, Albuquerque, N.M.; Todd C. Bryant, Phoenix, Ariz.

[73] Assignee: Applied Materials, Inc., Santa Clara, Calif.

[21] Appl. No.: 08/606,880

[22] Filed: Feb. 26, 1996

[51] Int. Cl.[6] ................. C23C 16/00; C23C 14/00; H01L 21/00
[52] U.S. Cl. ............. 118/715; 204/298.07; 204/298.33; 427/248.1; 438/935; 438/758; 438/689
[58] Field of Search ............ 118/715; 204/298.07, 204/298.33; 427/248.1; 438/935, 758, 689

[56] References Cited

U.S. PATENT DOCUMENTS

| | | | |
|---|---|---|---|
| 4,615,294 | 10/1986 | Scapple et al. | 118/50.1 |
| 4,622,918 | 11/1986 | Bok | 118/718 |
| 4,854,263 | 8/1989 | Chang et al. | 118/715 |
| 4,870,923 | 10/1989 | Sugimoto | 118/715 |
| 4,976,217 | 12/1990 | Frijlink | 118/733 |
| 4,986,216 | 1/1991 | Ohmori et al. | 118/730 |
| 5,000,113 | 3/1991 | Wang et al. | 118/723 E |
| 5,108,792 | 4/1992 | Anderson et al. | 427/248.1 |
| 5,118,642 | 6/1992 | Yoshino et al. | 437/225 |
| 5,127,365 | 7/1992 | Koyama et al. | 118/724 |
| 5,136,975 | 8/1992 | Bartholomew et al. | 118/715 |
| 5,269,847 | 12/1993 | Anderson et al. | 118/715 |
| 5,292,554 | 3/1994 | Sinha et al. | 427/251 |
| 5,304,248 | 4/1994 | Cheng et al. | 118/728 |
| 5,304,279 | 4/1994 | Coultas et al. | 156/345 |
| 5,318,632 | 6/1994 | Onodera | 118/715 |
| 5,338,363 | 8/1994 | Kawata et al. | 118/725 |
| 5,366,585 | 11/1994 | Robertson et al. | 156/643 |
| 5,374,315 | 12/1994 | DeBoer | 118/725 |
| 5,425,812 | 6/1995 | Tsutahara et al. | 118/725 |
| 5,441,568 | 8/1995 | Cho et al. | 118/715 |
| 5,516,367 | 5/1996 | Lei et al. | 118/725 |
| 5,518,547 | 5/1996 | Barnes et al. | 118/723 MA |
| 5,556,476 | 9/1996 | Lei et al. | 118/728 |
| 5,558,717 | 9/1996 | Zhao et al. | 118/715 |
| 5,599,397 | 2/1997 | Anderson et al. | 118/728 |

FOREIGN PATENT DOCUMENTS

0619381 A1  10/1994  European Pat. Off. .

Primary Examiner—R. Bruce Breneman
Assistant Examiner—Jeffrie R Lund
Attorney, Agent, or Firm—Townsend and Townsend and Crew LLP

[57] ABSTRACT

A method and apparatus for directing a process gas through a wafer processing apparatus, such as a vapor deposition chamber is provided. The apparatus comprises a pumping plate (4) defining a central opening (62) surrounding the wafer (W) and having an upper surface (64) facing the processing chamber (12) and a opposite, lower surface (66) facing a pumping channel (14). The plate defines a plurality of circumferentially spaced gas holes (90) extending between the first and second surfaces for discharging process gases from the chamber into the pumping channel. The gas holes are essentially straight so that they flow directly through the pumping plate, thereby minimizing the residence time of the gases within the processing chamber and reducing the time required to clean the gas holes. In addition, the gas holes extend in a radially outward direction relative to the central opening to substantially uniformly discharge the gas from the processing chamber. The radial orientation of the gas holes also allows the inlets of the gas holes to be located near the wafer so that the pumping plate can be designed to minimize the volume of the processing chamber.

28 Claims, 5 Drawing Sheets

METHOD AND APPARATUS FOR DIRECTING FLUID THROUGH A SEMICONDUCTOR PROCESSING CHAMBER

BACKGROUND OF THE INVENTION

The present invention relates to the fabrication of integrated circuits. More particularly, the invention provides a method and apparatus for directing process gas through a processing chamber.

High density integrated circuits, commonly termed VLSI devices, are typically formed on semiconductor wafers by subjecting the wafers to a number of deposition, masking, doping and etching processes. The wafers are placed onto a pedestal or susceptor within a process chamber and process gas(es) are delivered into the chamber onto the wafer to perform the various deposition and etching steps. For example, one typical process involves delivering $SiH_4$ and $N_2$ into the process chamber while applying RF energy to form a plasma for depositing silicon nitride on the wafer. Once the appropriate layer of silicon nitride is deposited onto the wafer, the remaining plasma and gas residue are withdrawn from the process chamber.

An important consideration in semiconductor processing is the application of process gases in a uniform and controlled manner across the wafer's entire surface. This consideration is particularly important in the fabrication of large scale integration (LSI) and very large scale integration (VLSI) devices since a large number of processing steps are generally used in sequence. To achieve uniform processing, existing systems typically introduce gases into the process chamber through a manifold plate or showerhead having a plurality of small openings for distributing the gas in a substantially uniform manner over the wafer. After the etching or deposition step has been completed, the plasma and gas residue are withdrawn from the process chamber by a suitable vacuum source, such as a pump. To facilitate uniform pumping dynamics, the process fluids will typically be discharged through a number of circumferentially spaced gas inlets in a pumping plate surrounding the susceptor. The fluid is then delivered through outlets in the pumping plate into a pumping channel disposed radially outward from and underneath the susceptor.

Many existing systems for directing process gas and plasma through semiconductor process chambers suffer from a number of drawbacks. For example, one known system comprises an annular pumping plate surrounding the wafer and having a number of fluid inlets circumferentially spaced about the perimeter of the plate. Gas holes extend straight through the pumping plate in a perpendicular direction relative to the wafer, thereby allowing the process gas to flow downward directly into the underlying pumping channel. Since the gas inlets are located at the perimeter of the plate, however, the gas must flow radially outward through the process chamber from the wafer to the perimeter of the plate before it exits the chamber through the gas inlets. This relatively long chamber flow path tends to increase the residence time of the gases within the chamber, thereby disrupting the uniform discharge of the gases from the wafer. In addition, a relatively larger chamber volume is generally required to accommodate the long chamber gas flow path, which increases the time required to remove contaminants from the chamber after the processing steps have been completed.

In another known system, the pumping plate comprises a plurality of gas holes extending perpendicular to the wafer and having circumferentially spaced inlets located adjacent to the wafer. The plate defines curved interior flow channels for allowing the gas to flow in a radially outward direction from the inlets to gas outlets located above the pumping channel. Since the inlets of the gas holes are located near the wafer, the pumping plate can be designed to extend into a portion of the process chamber, thereby decreasing the volume of the chamber. One disadvantage with this plate, however, is that the gases and plasma may become trapped within the curved interior flow channels, thereby clogging these channels and interfering with the pumping dynamics of the system. The curved interior flow channels also tend to increase the residence time of the gases within the process chamber because they do not provide a direct flow path from the chamber to the pumping channel. In addition, these interior channels increase the cost to manufacture the pumping plate and they can be relatively difficult to clean after the processing steps have been completed.

What is needed in the semiconductor manufacturing industry, therefore, are methods and apparatus for directing fluid through a process chamber. These methods and apparatus should be capable of discharging gases and plasma from the chamber in a controlled and uniform manner to minimize the creation of defects in the integrated circuitry being formed on the semiconductor wafer. In addition, these methods and apparatus should be designed to minimize the volume of the process chamber to reduce the residence time of the gases within the chamber and the time required to clean the chamber after processing has been completed.

SUMMARY OF THE INVENTION

The present invention provides a technique, including a method and apparatus, for directing fluid through a wafer processing apparatus, such as a vapor deposition chamber. The apparatus comprises a pumping plate defining a central opening for receiving a susceptor and having a first surface facing the processing chamber and a second opposite surface facing a pumping channel. The plate defines a plurality of circumferentially spaced gas holes extending between the first and second surfaces for discharging process gases and plasma from the chamber into the pumping channel. The gas holes are substantially straight so that the process gases will flow directly through the pumping plate. In addition, the gas holes extend in a radially outward direction relative to the central opening to substantially uniformly discharge the gas from the processing chamber.

One of the advantages of the present invention is that the gas holes extend radially outward from the central opening. This geometry allows the inlets of the gas holes to be located near the wafer so that the pumping plate can be designed to minimize the volume of the processing chamber. The radially directed gas holes also provide a substantially uniform discharge of the process gases from the chamber, thereby increasing the uniformity of deposition on the wafer. In addition, the gas holes are substantially straight from the processing chamber to the pumping channel so that the gases will flow directly through the pumping plate. This minimizes the residence time of the gases within the processing chamber, reduces the time required to clean the gas holes and minimizes any potential clogging within the pumping plate.

In a specific configuration, the pumping plate comprises an annular body member having first and second ends and a longitudinal axis therebetween. The gas holes are arranged symmetrically about the longitudinal axis to allow the gas to be uniformly drawn from the processing chamber into the pumping channel. The apparatus further comprises a generally U-shaped pumping channel disposed radially outward from the susceptor. The U-shaped pumping channel defines a vacant space underneath the first end of the pumping plate that does not communicate with the radially directed gas holes. To compensate for this vacant space, the first end of the pumping plate further defines a pair of non-radial gas holes extending from the processing channel to the two ends of the pumping channel. The non-radial gas holes preferably extend perpendicular to the longitudinal axis of the plate to discharge the process gases residing in the chamber region overlying the first end of the plate, thereby compensating for the vacant space defined by the U-shaped pumping plate.

In an exemplary embodiment, a vapor deposition processing apparatus includes an enclosure housing a process chamber and a susceptor disposed within the processing chamber for supporting a semiconductor wafer. The apparatus further includes an upper lid and a showerhead for uniformly distributing process gases into the chamber onto the wafer. In this embodiment, the pumping plate has a stepped upper surface so that the plate conforms to the processing apparatus, thereby reducing the volume of the processing chamber. To that end, the plate is preferably formed as a single piece plate having a plurality of layers, with a lower layer being sized to receive the susceptor, a middle layer sized to receive the showerhead and an upper layer sized to receive the lid of the apparatus. The inlets of the gas holes communicate with the process chamber between the lower and middle layers of the plate and extend radially outward to the pumping channel. With this configuration, the pumping plate minimizes the volume of the processing chamber, thereby reducing the cleaning time and decreasing the residence time of the process gases within the chamber.

The present invention achieves these benefits in the context of known process technology. However, a further understanding of the nature a advantages of the present invention may be realized by reference to the specification and attached drawings.

DESCRIPTION OF THE SPECIFIC EMBODIMENTS

Referring to the drawings in detail, wherein like elements are indicated by like numerals, a representative vapor deposition apparatus 2 capable of CVD processing incorporates a pumping plate 4 fabricated in accordance with the principles of the present invention. Vapor deposition apparatus 2 generally includes an enclosure assembly 6 having a vertically movable wafer support pedestal or susceptor 8 beneath a showerhead 10 through which process gas enters a vacuum chamber 12. Pumping plate 4 extends around susceptor 8 for discharging the process gas and other plasma residue from chamber 12 into a pumping channel 14 partially circumscribing chamber 12.

Figure 1:
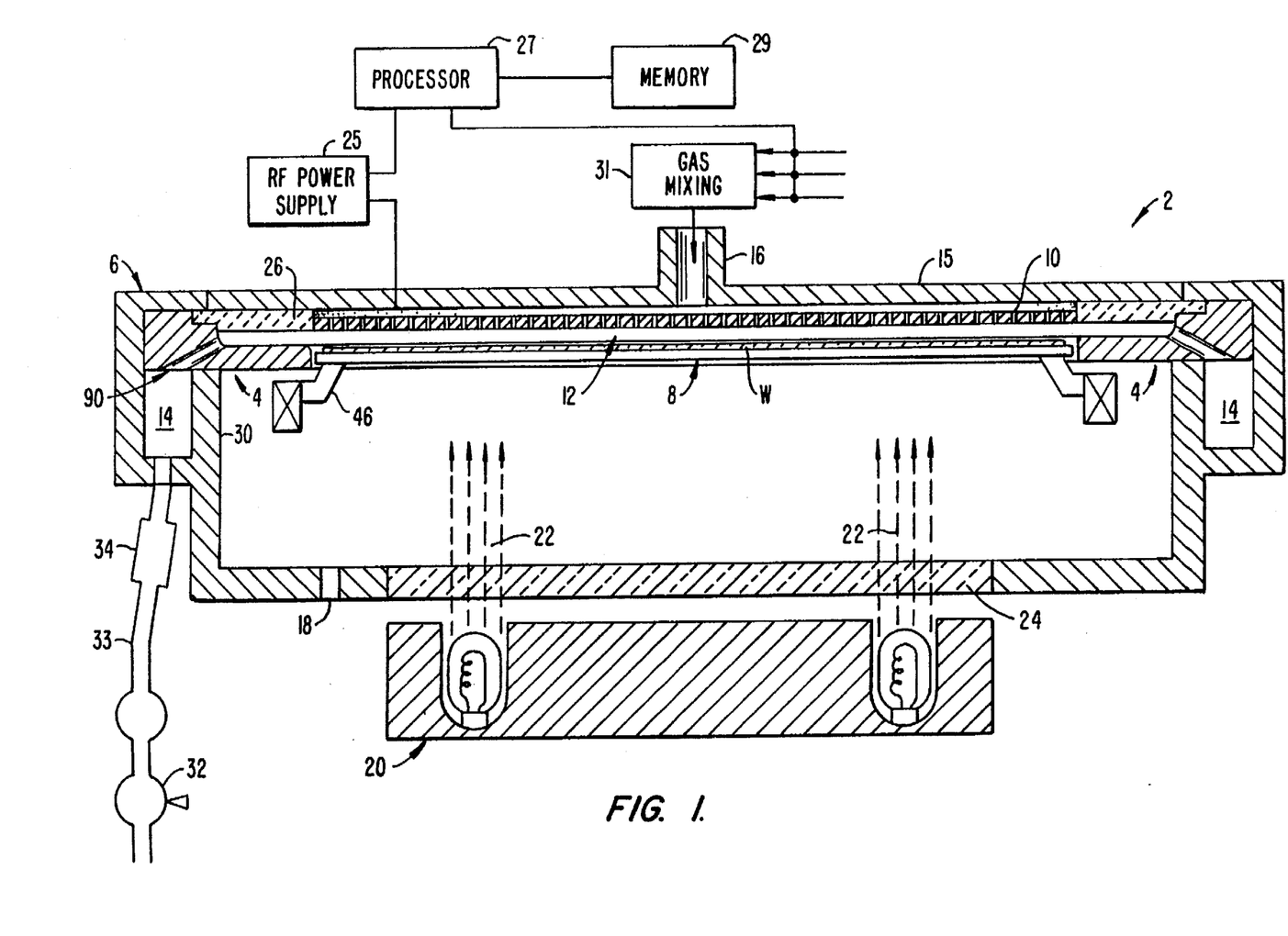
FIG. 1 schematically depicts a representative CVD plasma reactor incorporating a pumping plate according to the present invention.

Referring to FIG. 1, vapor deposition apparatus 2 is preferably attached to a mainframe unit (not shown) which provides electrical, plumbing and other support functions for the apparatus 2. Mainframe units that are compatible with the illustrative embodiment of vapor deposition apparatus 2 are currently commercially available as the Precision 5000™ and the Centura 5200™ systems from Applied Materials, Inc. of Santa Clara. It should be understood, however, that although the invention is shown and described as part of a vapor deposition chamber in a multi-chamber processing system, it is not intended to be limited in this manner. That is, the invention can be used in a variety of processing chambers, such as etch chamber, diffusion chamber or the like.

Enclosure assembly 6 is preferably an integral housing made from a process compatible material, such as aluminum. Assembly 6 includes an upper lid 15 and an inlet tube 16 for allowing deposition gases to enter showerhead 10, where it is uniformly dispersed throughout chamber 12 onto a wafer W supported on susceptor 8. The deposition process performed in apparatus 2 can be either a thermal process or a plasma enhanced process. In a plasma process, a controlled plasma is formed adjacent to the wafer by RF energy applied to showerhead 10 from an RF power supply 25. Showerhead 10 is also an RF electrode insulated from lid 15 by a ceramic shield 26, while susceptor 8 is grounded. RF power supply 25 can supply either single or mixed frequency RF power to showerhead 10 to enhance the decomposition of reactive species introduced into process chamber 12. Purging gas may be delivered into chamber 12 from an inlet port or tube 18 through the bottom wall of enclosure assembly 6. A circular external lamp module 20 provides a collimated annular pattern 22 of light via a quartz window 24 onto an annular outer peripheral portion of susceptor 8, thereby compensating for the natural heat loss pattern of the susceptor and providing rapid and uniform susceptor 8 and wafer W heating for effecting deposition.

As shown in FIG. 1, a sleeve or skirt member 30 depends downwardly from pumping plate 4 to define the pumping channel 14 surrounding the lower portion of apparatus 2. A pump 32 disposed exterior to apparatus 2 provides vacuum pressure within pumping channel 14 to draw both the process and purge gases out of the chamber 12 and through the pumping channel 14, where they are discharged from apparatus 2 along a discharge conduit 33. The flow rate of the gases through pumping channel 14 is preferably controlled by a throttle valve 34 disposed along conduit 33. The pressure within processing chamber 12 is monitored with sensors (not shown) and controlled by varying the flow cross-sectional area of conduit with throttle valve 34. Preferably, a microprocessor (not shown) receives signals from the sensors that indicate the chamber pressure and adjusts throttle valve 34 accordingly to maintain the desired pressure within chamber 12. A suitable throttle valve for use with the present invention is described in commonly assigned U.S. Pat. No. 5,000,225 to Murdoch, the complete disclosure of which is incorporated herein by reference.

Figure 5:
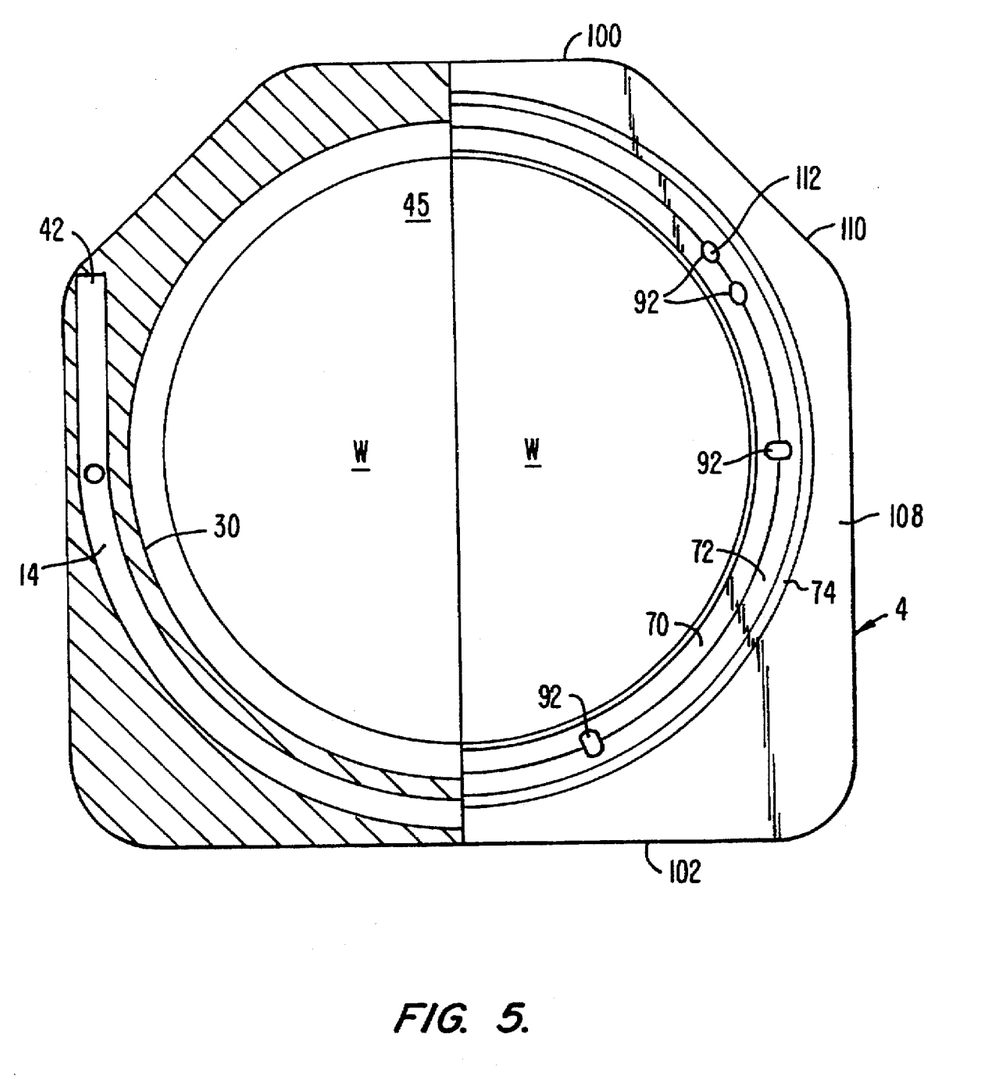
FIG. 5 is a top view of the CVD plasma reactor, partially cut-a-way to illustrate a pumping channel disposed below the pumping plate.
Figure 6:
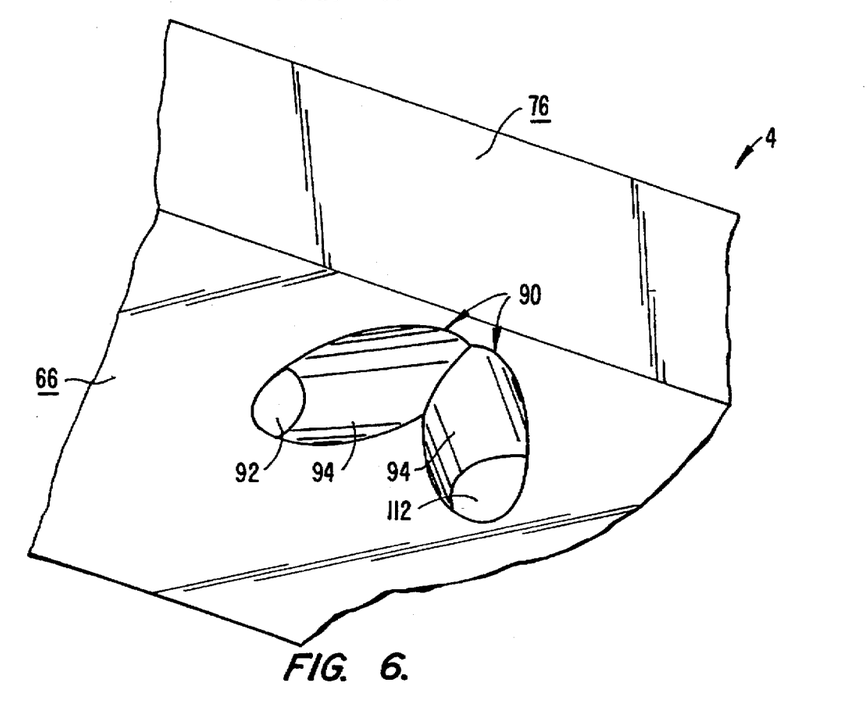
FIGS. 6 and 7 are enlarged views of FIGS. 2 and 3, taken along lines 6—6 and 7—7, respectively, illustrating gas holes within the pumping plate for delivering gas therethrough to the pumping channel.
Figure 7:
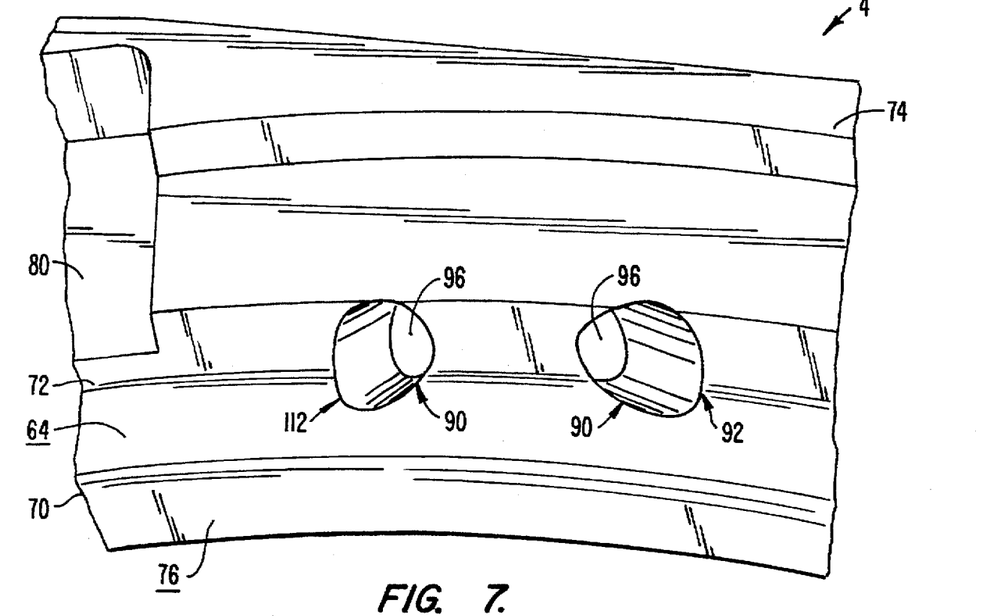

As shown in FIG. 5, enclosure assembly 6 defines a vacuum lock door (not shown) and a vacant space 45 through which a wafer loading assembly (not shown) transports a wafer W into process chamber 12 and loads wafer W onto the susceptor 8. The wafer loading assembly is preferably a conventional robotic mechanism disposed within a transfer chamber (not shown) of the multi-chamber processing system. A suitable robotic transfer assembly is described in commonly assigned U.S. Pat. No. 4,951,601 to Maydan, the complete disclosure of which is incorporated herein by reference. As shown in FIG. 5, pumping channel 14 is generally U-shaped and disposed radially outward from susceptor 8 to partially surround the wafer W. Pumping channel 14 has two ends 42 (only one end shown in FIG. 5) on either side of vacant space 45 so that channel 14 will not interfere with the operation of the loading assembly.

Referring again to FIG. 1, susceptor 8 comprises a disk made from a process compatible material, such as aluminum. Susceptor 8 has a planar upper surface 44 with a diameter approximately equal to the diameter of wafer W at the deposition temperature, e.g., at a temperature ranging from about 200° C. to about 700° C. This diameter will typically be about 6 to 8 inches for large size wafers and 3 to 5 inches for small size wafers. Susceptor 8 is preferably mounted on a vertically movable cantilevered beam or support fingers 46 so that the susceptor 8 (and the wafer supported thereon) can be controllably moved between a lower loading/unloading position where it is aligned with the wafer transfer assembly and an upper processing position, which is closely adjacent pumping plate 4. Support fingers 46 are vertically movable via a suitable motor (not shown). The motor and RF power supply 25 are controlled by a processor 27, which operates under the control of a computer program stored in a memory 29. The computer program dictates the timing, mixture of gases, chamber pressure, chamber temperature, RF power levels, susceptor position, and other parameters of a particular process.

Typically, any or all of the chamber lining, showerhead, support fingers, and various other reactor hardware is made out of material such as anodized aluminum. An example of such a CVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," issued to Chang et al. and assigned to Applied Materials, Inc., the assignee of the present invention, which is incorporated herein by reference for all purposes.

Figure 2:
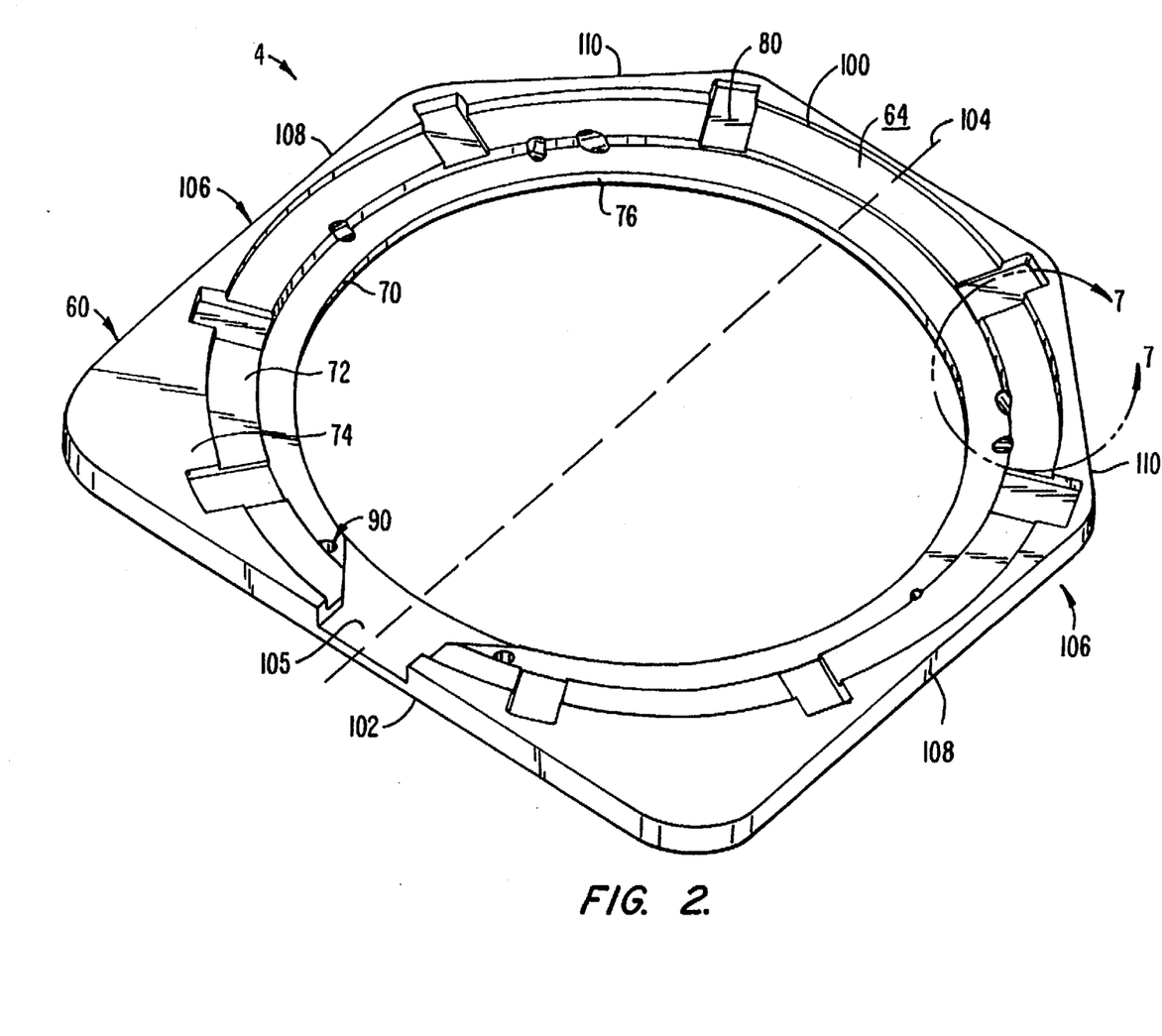
FIG. 2 is a perspective view of the upper side of the pumping plate of FIG. 1.

Referring to FIGS. 2–7, the pumping plate 4 of the present invention will now be described in detail. Pumping plate 4 comprises a generally annular body member 60 defining a central opening 62 for receiving susceptor 8 and wafer W (see FIG. 4). Body member 60 is an integral piece comprising a process compatible metal, such as aluminum alloy, that will be suitably shaped to fit within a particular semiconductor processing chamber. In the specific configuration described herein, body member 60 has an upper, stepped surface 64 (FIG. 2) facing processing chamber 12 and a lower, generally planar surface 66 (FIG. 3) facing pumping channel 14. As shown in FIG. 2, stepped surface 64 divides body member 60 into three portions or layers 70, 72, 74 stacked on top of each other. It should be noted that body member 60 is preferably constructed of a single, integral piece of metal and the different portions of member 60 are referred to as layers merely for illustration purposes.

Figure 4:
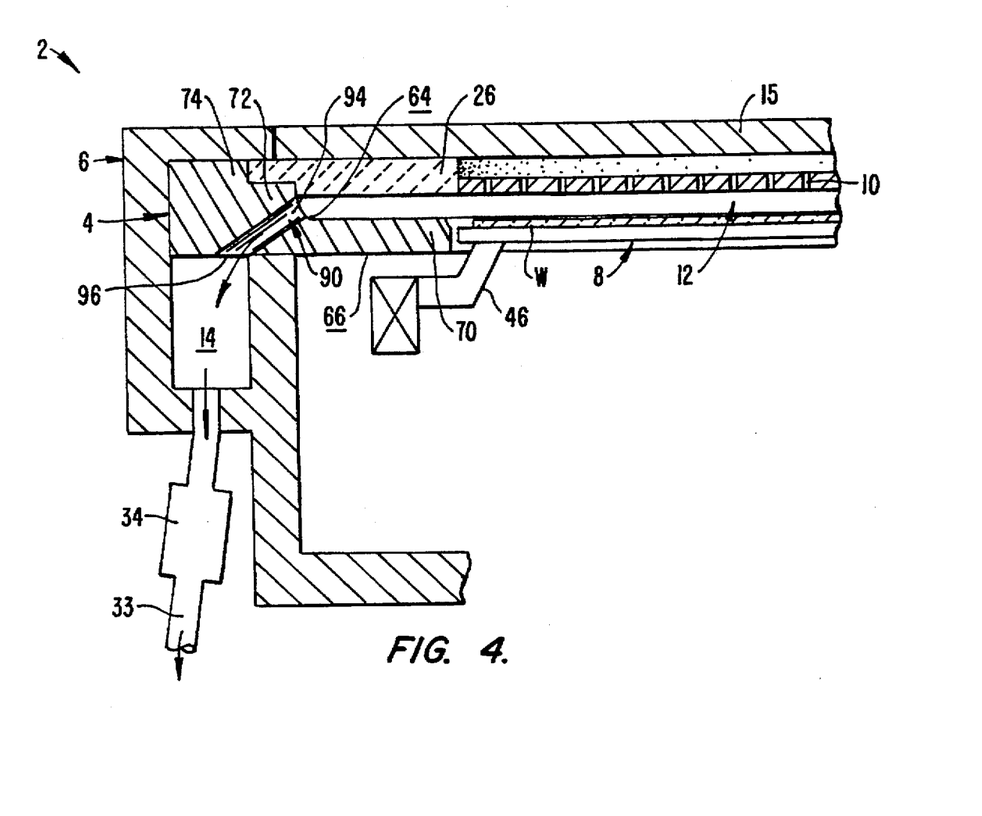
FIG. 4 is an expanded cross-sectional view of the CVD plasma reactor, illustrating the flow of gas from a process chamber through the pumping plate of FIGS. 2 and 3.

The first layer 70 of body member 60 defines a side surface 76 that surrounds central opening 62 and preferably has an inner diameter slightly larger than the diameter of susceptor 8, e.g., about 250 to 280 mm, so that the wafer can be brought into the upper processing position without contacting plate 4 (see FIG. 4). Purge gas will typically be delivered through the gap between plate 4 and susceptor 8 to minimize leakage of the process gas into the lower portion of apparatus 2. First layer 70 has a thickness selected so that a space, i.e. a portion of processing chamber 12, exists between the upper surface of layer 70 and ceramic shield 26. The thickness of first layer 70 is usually about 600 to 700 mm and preferably about 620 to 650 mm.

As shown in FIG. 4, second and third layers 72, 74 of body member 60 are sized to form a relatively tight fit between ceramic shield 26, lid 15 and enclosure assembly 6. Second layer 72 usually has a diameter of 250 to 350 mm and preferably 280 to 300 mm and a thickness of 11 to 12 mm, preferably about 11.2 to 11.5 mm. Third layer 74 will usually have a diameter of 300 to 350 mm, preferably 315 to 330 mm, and a thickness of about 15 to 16 mm, preferably about 15.5 to 15.8 mm. As shown in FIG. 2, second layer 72 further comprises a plurality of stand-offs 80 protruding inwardly from layer 72 for holding showerhead 10 in place. With this configuration, pumping plate 4 is sized to minimize the volume of processing chamber 12. Minimizing the size of the processing chamber provides a number of advantages including reducing the time required to remove contaminants from the interior surface surrounding the processing chamber after wafer processing.

Figure 3:
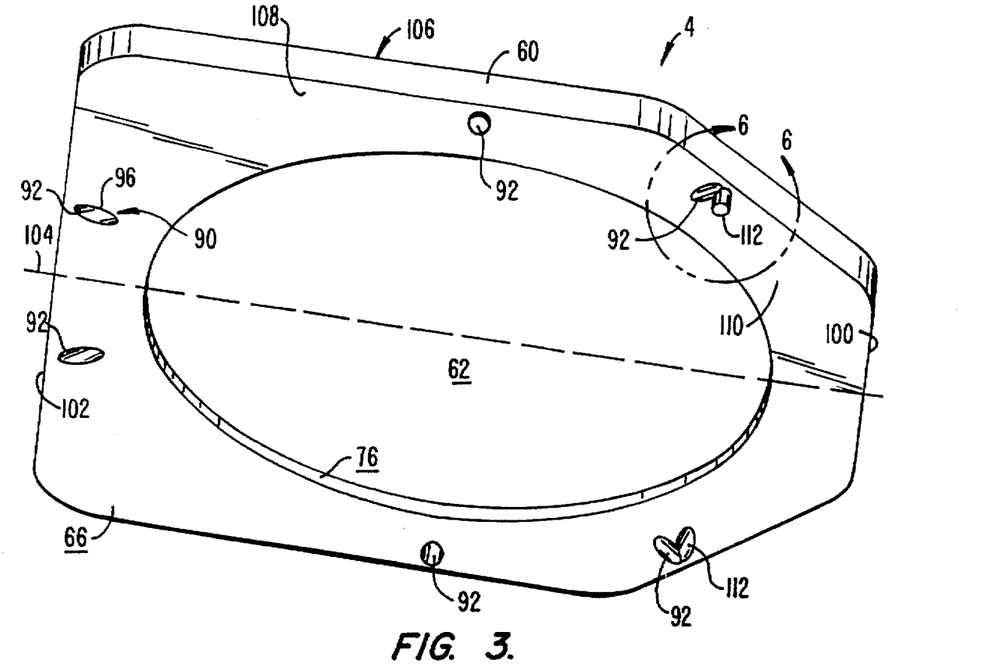
FIG. 3 is a perspective view of the lower side of the pumping plate of FIG. 1.

Referring to FIGS. 2–4, pumping plate 4 comprises a plurality of gas holes 90 that directly communicate process chamber 12 with pumping channel 14. Gas holes 90 are circumferentially spaced around central opening 62 to facilitate the uniform discharge of process gas through holes 90. Gas holes 90 have inlets 94 communicating with the upper surface 64 of plate 4 between first and second layers 70, 72 and outlets 96 communicating with lower surface 66. Inlets 94 are preferably located adjacent central opening 62 so that plate 4 can be designed to reduce the volume of process chamber 12 (i.e., by increasing the thickness of second and third layers 72, 74 to extend upwards into the chamber). Accordingly, inlets 94 are positioned about 12 to 15 mm from opening 62 and preferably 13 to 14 mm. Outlets 96 are positioned radially outward from inlets 94 so that outlets 96 will communicate with pumping channel 14. In the preferred configuration, outlets 96 are radially spaced a distance of 11 to 15 mm from inlets 94.

To accommodate the relative positions of inlets 94 and outlets 96, gas holes 90 extend in a radially outward direction from inlets 94 to outlets 96 relative to central opening 62 (see FIG. 4). This radial orientation of holes 90 also contributes to a substantially uniform discharge of the process and purge gases and any plasma residue from the processing chamber 12. Gas holes 90 are also inclined with respect to planar lower surface 66, preferably at an angle of 15 to 22 degrees, so that the gases can be directly fed from chamber 12 into channel 14. Gas holes 90 preferably extend substantially straight through plate 4 to reduce clogging within plate 14 and to increase the uniformity of deposition within chamber 12. Preferably, holes 90 have a diameter of 7 to 9 mm and more preferably 7.8 to 8.2 mm. The length of the gas holes will depend on the characteristics of the individual deposition apparatus, such as the diameter of showerhead 10, the radial distance between pumping channel 14 and chamber 12 and the height of susceptor 8 (i.e., the axial distance between channel 14 and chamber 12). In the specific configuration discussed above, gas holes 90 will have a length of 15 to 24 mm.

As depicted in FIGS. 2 and 3, body member 60 of pumping plate 4 is preferably hexagonal and includes first and second ends 100, 102 and a longitudinal axis 104 therebetween. Of course, it will be readily recognized by those skilled in the art that the present invention is not limited to this geometry. The pumping plate 4 can have a variety of shapes, such as circular, oval, rectangular, U-shaped, C-shaped, etc. Gas holes 90 are positioned symmetrically about longitudinal axis 104 to facilitate the uniform discharge of process gases from chamber 12. Plate 4 defines opposing sides 106 each having a first portion 108 generally perpendicular to longitudinal axis 104 and a second portion 110 that tapers inward toward first end 100. As shown in FIG. 5, pumping plate 4 is oriented within chamber 12 so that first end 100 is disposed above vacant space 45 between ends 43, 44 of pumping channel 14. Plate 4 further includes a recess 105 between opening 62 and second end 102 for providing a porthole for viewing the wafer during processing.

As discussed above, the U-shaped pumping channel 14 does not completely surround susceptor 8 and, therefore, does not extend underneath the entire portion of pumping plate 4 (FIG. 5). Accordingly, radially oriented gas holes 90 are not positioned between first end 100 and central opening 62 because these holes would not communicate with pumping channel 14. Because of the restraint placed on pumping plate 4 by the geometry of the vapor processing chamber, process gases within the portion of chamber 12 overlying the wafer transfer assembly will not flow through gas holes 90, potentially causing the gases to stagnant within this portion of the chamber 12. To compensate for this potential stagnation region, pumping plate 4 preferably includes a second group 112 of gas holes disposed at either end 43, 44 of pumping channel 14. The second group 112 of holes preferably comprises two holes that extend generally perpendicular to longitudinal axis 104 of plate 4 from chamber 12 to pumping channel 14, as shown in FIGS. 3 and 5. Gas holes 112 are each positioned adjacent to one of the first group 92 of holes and generally extend transversely to lower surface 66 of plate 4 at approximately the same angle as the first group of gas holes.

The method for processing a semiconductor wafer W according to the present invention will now be described. Wafer W is first positioned onto the upper surface of susceptor 8 with a support blade (not shown) of the robotic wafer transfer system. Susceptor 8 is raised into the upper processing position within process chamber 12 via conventional means, such as a hydraulic lift, so that wafer W resides within central opening 62 of plate 4. The interior of apparatus 2 is then evacuated to a suitable vacuum pressure, while the wafer W and susceptor 8 are suitably heated. Process gases, such as $SiH_4$ and $N_2$, are mixed in a mixing chamber 31 of a manifold head (not shown) and introduced through inlet tube 16 and distributed uniformly over wafer W via showerhead 10. Depending on the particular process, a portion of the wafer substrate will be etched with the process gases or a layer, such as an oxide or nitride layer, will be deposited onto the wafer. In plasma processes, RF energy may be applied to the chamber to create a plasma from the process gas for depositing a layer of material, such as silicon nitride, on the wafer.

During the deposition process, pump 32 is activated to generate vacuum pressure within pumping channel 14, thereby drawing the process gases and plasma residue out of processing chamber 12 through gas holes 90 of pumping plate 4. In addition, purge gas may be directed through inlet 18 and into processing chamber 12 through the gap between susceptor 8 and plate 4. The purge gas minimizes leakage of process gas into the lower portion of apparatus 2 and facilitates the removal of the process gas through holes 90.

The gases will flow uniformly into inlets 94 and through the radially directed holes 90 so as to effect a uniform deposition on wafer W. Process gases will also flow through non-radial holes 112 into the ends of pumping channel 14 to purge the region of process chamber 12 overlying vacant space 45.

The gases will flow directly through the straight holes 90 to outlets 96, thereby minimizing the residence time of the gases within chamber and reducing the possibility of gases becoming trapped with pumping plate 4. The straight geometry of gas holes 90 also minimizes the time required to remove contaminants from the inner surfaces of these holes after the wafer processing has been completed. Upon exiting outlets 96, the gases will be directed through pumping channel 14 and throttle valve 34 and discharged along line 33.

While the above is a full description of the specific embodiments, various modifications, alternative constructions and equivalents may be used. For example, although the invention is shown and described as part of a parallel plate CVD reactor in a multi-chamber processing system, it not intended to be limited in this manner. That is, the invention can be used in a variety of processing chambers, such as chemical or physical vapor deposition chambers, or cooling chambers to, for example, cool the wafer after high temperature processing.

In addition, it should be further noted that although the invention is not limited to a single wafer chamber as described above and shown in the enclosed drawings. For example, the pumping plate could be installed into batch chambers that simultaneously perform processing on a plurality of wafers. In addition, the invention would be suitable for use in a multi-wafer chamber that sequentially performs individual processing steps on each of the wafers.

What is claimed is:

1. A pumping plate for a semiconductor processing chamber comprising:

a pumping plate having first and second opposing surfaces and a plurality of spaced fluid holes communicating the first and second surfaces with each other; and wherein the fluid holes are substantially straight such that fluids within the processing chamber flow directly through the pumping plate, the fluid holes extending at a non-perpendicular, non-horizontal angle from the first surface to the second surface in a radially outward direction.

2. The pumping plate of claim 1 wherein the body member defines an inner space sized for receiving a semiconductor wafer and a plurality of inlets in the first surface, the inlets being circumferentially spaced about the inner space and fluidly communicating the inner space with the fluid holes.

3. The pumping plate of claim 2 wherein the body member defines a plurality of outlets in the second surface in communication with the fluid holes, the outlets being spaced radially outward from the inlets.

4. The pumping plate of claim 1 wherein the fluid holes extend in a substantially straight direction from the inlets to the outlets, the fluid holes being transverse to the second surface of the body member.

5. The pumping plate of claim 4 wherein the fluid holes are oriented at an angle of 15 to 24 degrees relative to the second surface.

6. The pumping plate of claim 1 wherein the body member is an annular disk having a side wall defining a central opening, the fluid holes being circumferentially-spaced around the central opening to uniformly discharge the gas from the processing chamber.

7. The pumping plate of claim 6 wherein the annular disk comprises a single, integral piece defining first and second ends and a longitudinal axis therebetween, the inlets being arranged symmetrically about the longitudinal axis.

8. The pumping plate of claim 7 further comprising a second group of fluid holes extending substantially straight between the first and second surfaces of the body member, the second group of fluid holes being perpendicular to the longitudinal axis.

9. The pumping plate of claim 8 wherein the second group of fluid holes extend in a transverse direction relative to the second surface.

10. The pumping plate of claim 9 wherein the annular disk defines first, second and third layers, the first layer surrounding said central opening and having a first thickness, the second layer being contiguous with the first layer and having a second thickness greater than the first thickness, the third layer being contiguous with the second portion and having a third thickness greater than the second thickness.

11. The pumping plate of claim 10 wherein the inlets of the first and second groups of fluid holes are disposed between the first and second layers of the annular disk.

12. An apparatus for fabricating an integrated circuit device comprising:
an enclosure housing a processing chamber, the enclosure defining a gas inlet in communication with the processing chamber for receiving processing gas and a gas outlet for discharging the processing gas;
a susceptor disposed within the processing chamber for supporting a wafer thereon; and
a pumping plate having first and second opposite surfaces and a side wall defining an inner space for receiving the susceptor, the pumping plate defining a plurality of gas holes circumferentially spaced about the susceptor and communicating the first and second surfaces with each other for discharging gas from the processing chamber to the gas outlet, the gas holes being substantially straight such that the gas flows directly through the pumping plate, the gas holes extending from the first surface to the second surface in a radially outward direction to substantially uniformly discharge the gas from the processing chamber.

13. The apparatus of claim 12 further comprising a generally U-shaped pumping channel communicating the gas outlet with the gas holes in the pumping plate and a pump for drawing gas from the processing chamber, the pumping channel being disposed radially outward from the processing chamber and the susceptor.

14. The apparatus of claim 13 wherein the pumping channel is disposed underneath the pumping plate and the susceptor, the gas holes each extending in a transverse direction relative to the second surface to directly communicate the pumping channel with the processing chamber.

15. The apparatus of claim 13 wherein the pumping plate comprises an annular pumping plate defining a central opening and a plurality of inlets circumferentially spaced around the central opening and communicating with the gas holes to radially uniformly discharge the gas from the processing chamber into the U-shaped pumping channel.

16. The apparatus of claim 13 wherein the pumping plate comprises a single, integral piece defining first and second ends and a longitudinal axis therebetween, the gas holes being arranged symmetrically about the longitudinal axis.

17. The apparatus of claim 13 wherein the U-shaped pumping channel has first and second ends defining a vacant space therebetween, the susceptor being disposed within the processing chamber such that, when the wafer is positioned on the susceptor, a portion of the wafer overlies the vacant space.

18. The apparatus of claim 17 wherein the pumping plate further comprises a second group of gas holes disposed to distribute gas from the portion of the susceptor overlying the vacant space into the pumping channel.

19. The apparatus of claim 18 wherein the second group of gas holes are perpendicular to the longitudinal axis of the pumping plate and extend substantially straight from the processing chamber into the ends of the U-shaped pumping channel.

20. The apparatus of claim 12 further comprising a manifold face plate disposed between the susceptor and the gas inlet for distributing gas onto the wafer during processing and a shield surrounding the manifold face plate, the shield having an outer surface and a diameter greater than a diameter of the susceptor.

21. The apparatus of claim 20 wherein the pumping plate defines first, second and third layers, the first layer being sized to surround the susceptor and having a first thickness, the second layer being sized to surround a portion of the shield and having a second thickness greater than the first thickness, the third layer being contiguous with the second layer, sized to surround the entire shield and having a third thickness greater than the second thickness so as to minimize a volume of the processing chamber.

22. A method for directing fluid through a semiconductor processing chamber comprising:
introducing a supply of gas onto a wafer within the processing chamber; and
distributing the gas radially outward at a non-perpendicular non-horizontal angle through substantially straight holes in a pumping plate circumscribing the wafer to discharge the gas from the processing chamber.

23. The method of claim 22 wherein the distributing step comprises delivering the gas through circumferentially spaced inlets surrounding the wafer and in communication with the holes.

24. The method of claim 22 wherein the distributing step comprises delivering the gas directly through the holes into a U-shaped pumping channel partially surrounding the wafer, the U-shaped channel having first and second ends that define a vacant space therebetween.

25. The method of claim 24 further comprising delivering a portion of the gas through gas holes in a perpendicular direction relative to the first and second ends of the U-shaped pumping channel.

26. The method of claim 22 wherein the distributing step comprises directing the gas through the gas holes in a transverse direction relative to a susceptor.

27. The method of claim 26 wherein the transverse direction is downwardly in a direction from the susceptor to the pumping channel.

28. A method of fabricating an integrated circuit device comprising:
loading a wafer onto a susceptor within a processing chamber;
introducing a supply of gas through a gas inlet onto the wafer;
distributing the gas radially uniformly into gas holes in a pumping plate circumscribing the wafer;
directing the gas radially outward in a substantially straight direction through the gas holes directly into a pumping channel; and
discharging the gas through a gas outlet.

* * * * *